United States Patent
Horikoshi

(10) Patent No.: US 9,977,326 B2
(45) Date of Patent: May 22, 2018

(54) PELLICLE FOR EUV

(71) Applicant: Shin-Etsu Chemical Co., Ltd., Tokyo (JP)

(72) Inventor: Jun Horikoshi, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days. days.

(21) Appl. No.: 15/296,507

(22) Filed: Oct. 18, 2016

(65) Prior Publication Data

US 2017/0108771 A1    Apr. 20, 2017

(30) Foreign Application Priority Data

Oct. 19, 2015 (JP) ................................. 2015-205215

(51) Int. Cl.
*G03F 1/64*  (2012.01)
*G03F 7/20*  (2006.01)

(52) U.S. Cl.
CPC .............. *G03F 1/64* (2013.01); *G03F 7/2004* (2013.01)

(58) Field of Classification Search
CPC ................................. G03F 1/64; G03F 7/2004
USPC ............................................................ 430/5
See application file for complete search history.

(56) References Cited

U.S. PATENT DOCUMENTS

| 5,300,348 | A | 4/1994 | Kubota et al. |
| 7,442,815 | B2 | 10/2008 | Matsukura et al. |
| 2005/0147897 | A1 | 7/2005 | Matsukura et al. |

FOREIGN PATENT DOCUMENTS

| EP | 1548014 A1 | 6/2005 |
| JP | 2011-53603 A | 3/2011 |
| JP | 2015-18228 A | 1/2015 |

OTHER PUBLICATIONS

European Search Report dated Apr. 7, 2017 issued in corresponding EP 16192598 application (5 pages).
English Abstract of JP 2011-053603 A published Mar. 17, 2011.
English Abstract of JP 2015-018228 A published Jan. 29, 2015.

*Primary Examiner* — Christopher G Young
(74) *Attorney, Agent, or Firm* — Millen White Zelano and Branigan, PC

(57) ABSTRACT

A pellicle is proposed in which an adhesive layer which adheres a pellicle film to a pellicle frame is mixed (filled) with powder of thermally conductive material such as metallic compound so that the heat generated by the strong EUV ray is quickly passed to the pellicle frame from the pellicle film lest the latter is deformed by the heat.

9 Claims, 1 Drawing Sheet

PELLICLE FOR EUV

The present non-provisional application claims priority under 35 U.S.C. § 119(a) from Japanese Patent Applications No. 2015-205215 filed on Oct. 19, 2015, the entire disclosure of which is hereby incorporated herein by reference.

FIELD OF THE INVENTION

The present invention relates to a pellicle which is used as a dust-fender in the manufacture of semiconductor devices, printed circuit boards, liquid crystal displays and the like, and in particular the invention relates to a pellicle for EUV which is used in a lithography wherein EUV (Extreme Ultra Violet) light is employed.

TECHNICAL BACKGROUND OF THE INVENTION

In manufacturing semiconductor devices such as LSI and super-LSI or in manufacturing a liquid crystal display board or the like, a pattern is made by irradiating a light onto a semiconductor wafer or an original plate for liquid crystal, but if dust is attached to a photo mask or a reticle (hereinafter collectively referred to as "photo mask" for simplicity) which is used during the irradiation operation, the resulting pattern would have roughened edges or black stains on the base, which would lead to problems such as damaged dimensions, poor quality, and a deformed external appearance.

Thus, these works are usually performed in a cleanroom, but it is still not easy to keep the photo mask clean all the time. Therefore, a pellicle is attached to a surface of the photo mask as a dust-fender before light exposure is carried out. Under such circumstances, foreign substances do not directly adhere to the surface of the photo mask but adhere only to the pellicle film, and since this film is sufficiently remote from the photo mask surface if the photo focus is set on a lithography pattern on the photo mask, the foreign substances on the pellicle film fail to transfer their shadows on the photo mask and thus no longer become a cause for problems for the image transfer performance.

In general, a pellicle is made by adhering a transparent pellicle film made of a highly light transmitting material such as cellulose nitrate, cellulose acetate, fluorine-containing polymer and the like to one of the two annular end faces of a pellicle frame made of aluminum, stainless steel, polyethylene or the like, using as the glue either a solvent capable of dissolving the pellicle film, which is applied to said annular end face (hereinafter this face is called "upper end face") and then air-dried before receiving the film (ref. IP Publication 1), or an adhesive such as acrylic resin, epoxy resin or the like (ref. IP Publication 2, IP Publication 3, and IP Publication 4). Further the other annular end face (hereinafter called "lower end face") of the pellicle frame is covered with an agglutinant made of polybutene resin, polyvinyl acetate resin, acrylic resin, silicone resin or the like for attaching the pellicle frame to a photo mask, and over this agglutinant layer is laid a releasing layer (separator) to protect the agglutinant layer.

In a case wherein, after a pellicle such as the kind explained above is adhered to a face of a photo mask, a photo resist film formed on a semiconductor wafer or an original plate for making a liquid crystal panel is exposed to a light via the photo mask, foreign matter such as dust is caught on the pellicle surface and thus is prevented from reaching the surface of the photo mask so that it is possible to avoid the effect of the foreign particle such as dust if the exposure light is emitted in a manner such that the focus occurs on the plane of the pattern formed on the photo mask.

In recent years, the semiconductor devices and the liquid display board have undergone further heightening in integration and densification. Currently, a technology of forming a fine pattern having a density level of 32 nm on a photo resist film is on the verge of realization. Such patterning can be effectively achieved by improved technologies such as an immersion exposure method, wherein the space between the semiconductor wafer or the original plate for liquid crystal on one hand and the projection lenses on the other is filled with a liquid such as super pure water and the photo resist film is exposed to an argon fluoride (ArF) eximer laser, or the double exposure method, which uses a conventional argon fluoride (ArF) eximer laser, to which the photo resist film is exposed.

However, the next-generation semiconductor devices and the liquid display board are being demanded to have even denser patterning of a level of 10 nm or further, and the conventional exposure technology depending on an excimer laser no longer can be improved to answer such a high demand for making a dense pattern of the level of 10 nm or denser.

Now, as a most promising method for forming a pattern of a density of 10 nm or denser, an EUV exposure technology which uses an EUV light of a dominant wavelength of 13.5 mm is in the spotlight. To achieve a pattern formation on the density level of as high as 10 nm or denser on the photo resist film, it is necessary to solve the technical problems with regard to the choices of light source, photo resist, pellicle, etc., and with respect to light source and photo resist, considerable progress and various proposals have been made.

With respect to a pellicle that improves yields of semiconductor device products or liquid crystal displays, IP Publication 3, for example, discloses a silicon film of a thickness of 0.1-2.0 micrometers to act as the pellicle film for EUV lithography which is transparent and does not give rise to optical distortion; however there remain unsolved problems which have prevented realization of the EUV light exposure technology.

PRIOR ART PUBLICATIONS

Publications

[IP Publication 1]
Japanese Patent Application Publication S58[1983]-219023
[IP Publication 2]
Japanese Pre-Patent Publication for Public Review S63 [1988]-27707
[IP Publication 3]
U.S. Pat. No. 6,623,893
[IP Publication 4]
U.S. Pat. No. 4,861,402

SUMMARY OF THE INVENTION

Problems the Invention Seeks to Solve

With respect to materials to make the adhesive for bonding the pellicle film to the pellicle frame, the selection has been made solely based on their adhesive strength in the case of conventional lithography where the exposure lights used were i-line (wavelength of 365 nm), krypton fluoride (KrF)

excimer laser (wavelength of 248 nm), or argon fluoride (ArF) excimer laser (wavelength of 193 nm).

However, in the case of the EUV exposure light lithography, where a pattern of a fineness order of 10 nm or smaller is printed on the photo resist film, the result of a recently conducted simulation indicates that it is possible that the portion of the pellicle film of silicon which is irradiated with the EUV light is heated to a temperature in the vicinities of 500 degrees C. by means of the energy of the EUV light. The pellicle film, the adhesive and the pellicle frame are made respectively of different materials so that the difference in their linear expansion coefficients would cause uneven expansion of them when heated.

Also, in general an adhesive made of organic substance has relatively low thermal conductivity, so that the pellicle film cannot effectively pass to the pellicle frame the heat it receives from the irradiation energy of the EUV light, with a consequence that the heat would deform the pellicle film so much that extra high density light exposure would be unattained. Also in the worst scenario the pellicle film could break and fall on the photo resist. Therefore, it is necessary to quickly pass the heat caused by the irradiation energy of the EUV light to the pellicle frame and outer parts.

For reference purpose, thermal conductivity data and linear thermal expansion coefficient data of various materials are given below.
[Reference-Purpose Data (1); Thermal Conductivities of Materials]
silicon (pellicle film): 170 W/(m·K)
quartz glass (photo mask): 1.5 W/(m·K)
silicone resin (adhesive): 0.2 W(m·K)
acrylic resin (adhesive): 0.2 W(m·K)
aluminum (pellicle frame): 240 W(m·K)
[Reference-Purpose Data (2): Linear Expansion Coefficients of Materials]
silicon (pellicle film): $2.4 \times 10^{-6}$ (/K)
quartz glass (photo mask): $0.5 \times 10^{-6}$ (/K)
silicone resin (adhesive): $300 \times 10^{-6}$ (/K)
acrylic resin (adhesive): $200 \times 10^{-6}$ (/K)
aluminum (pellicle frame): $23 \times 10^{-6}$ (/K)

Accordingly, the present invention was contrived in view of these problems, and it is an object of the invention to provide a pellicle for EUV which is less liable to have its pellicle film deformed, broken or dropped despite the irradiation energy of the EUV exposure light.

Means to Solve the Problems

In order to attain these objects, the inventor researched hard and came to a discovery that out of the many types of adhesives, the adhesive compositions made of 100 mass parts of adhesive material and 100 through 4,000 mass parts of thermally conductive filler are expedient for use with EUV exposure light lithography or the like, and thus possessed the invention.

Therefore, the pellicle for EUV of the present invention comprises a pellicle film, a pellicle frame to which the pellicle film is adhered via an adhesive layer laid on one end face of the pellicle frame, and an agglutinant layer laid on the other end face of the pellicle frame for bonding the pellicle to a photo mask. In order to attain the above-mentioned object, the pellicle of the present invention is characterized in that its adhesive layer is made of an adhesive composition containing thermally conductive filler. Throughout this specification, the term of "thermally conductive filler" means powder of a substance which has a thermal conductivity higher than that of the adhesive used to make the adhesive layer.

Effects of the Invention

According to the present invention, the heat created in the pellicle film by the energy of the EUV exposure light is quickly passed to the pellicle frame by virtue of the adhesive containing the thermally conductive filler so that a pellicle for EUV has been provided in which the pellicle film is not liable to deform, break, or fall.

EXAMPLES TO EMBODY THE INVENTION

We will now explain in detail with reference to the drawings how the present invention can be embodied, but the invention is not limited to such embodiments.

Figure 1:
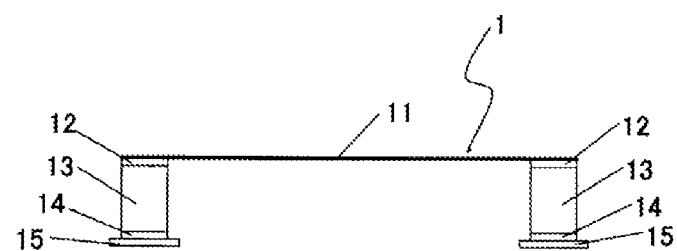
FIG. 1 A longitudinal cross section of the pellicle of the present invention.

FIG. 1 is a longitudinal cross section of an example of the pellicle of the present invention. In this pellicle 1, a pellicle frame 13, which ordinarily has a quadrilateral shape (rectangular or square) to meet the shape of the photo mask (or its glass substrate part), not shown, to which the pellicle 1 is to be affixed, and a pellicle film 11 is tensely adhered to the upper end face of the pellicle frame 13 by means of an adhesive layer 12. Also an agglutinant layer 14 is provided to the lower end face of the frame 13 by which the pellicle is agglutinated to the photo mask. Also, a releasing layer (separator) 15 is detachably attached to the agglutinant's lower face so as to protect the agglutinant layer 14. The adhesive layer 12 is formed of an adhesive composition prepared by doping an adhesive material with thermally conductive filler.

Now, there is no particular limitation as to the materials of the pellicle film 11, and any conventionally used material may be used. For use with EUV exposure light, it is preferable to adopt silicon or the like which has a high transmission coefficient with respect to EUV light.

Nor is there a limitation to the choice of materials for the pellicle frame 13, and any conventionally used material may be used, such as a metal like aluminum and stainless steel or an alloy, or a synthetic resin like polyethylene; however, metals are preferred on account of their higher ability of heat radiation.

In the present invention, the pellicle film and the pellicle frame are bonded together via an adhesive layer. The adhesive layer is made of an adhesive composition comprising the adhesive material and thermally conductive filler. The adhesive layer is laid on the upper end face of the pellicle frame, the adhesive layer having a predetermined width (which is ordinarily either equal to or smaller than the width of the upper end face of a frame bar of the pellicle), so that it is possible to bond the pellicle film along the entire track of the upper end face of the pellicle frame.

As the adhesive material it is possible to use polybutene-containing adhesive, polyvinyl acetate-containing adhesive, acrylic type adhesive, silicone type adhesive, and the like, which are used as the base material for the adhesive composition; among these silicone type adhesive and acrylic type adhesive are especially appropriate as the base material for the adhesive composition.

As for the silicone type adhesive material, those put on the market by Shin-Etsu Chemical Co., Ltd. are useful for example, and those that have a high heat-resisting property are preferable on account of the anticipated uses at high temperatures (for example, KE-101A/B, KE-1285A/B, KE-1803A/B/C, KE-1854, and KE-1880, which are product names of the silicone adhesives manufactured by Shin-Etsu Chemical Co., Ltd, are recommended).

As for the acrylic type adhesive, those put on the market by Soken Chemical Co., Ltd are useful such as those from SK Dyne series (Product Name).

The above-mentioned adhesive materials maintain their adhesive strength even when they are subjected to high temperatures; for example, the aluminum tensile shearing adhesion strength of KE1285A/B is 1.8 MPa primarily, and it remains at 1.5 MPa after a 1000-hour heat-resistance test at 150 degrees C. If the aluminum tensile shearing adhesion strength after the 1000-hour heat-resistance test at 150 degrees C. is 70% or greater of the primary value before the test, it is preferable because such an adhesive material can maintain sufficient adhesive strength even when it is heated by EUV light; it is more preferable if 90% or greater adhesive strength is retained after the test.

Also, among the silicone type adhesive materials, KE-101A/B (Product name of Shin-Etsu Chemical Co., Ltd.) is preferable for its high heat resistance and low evaporation of volatile elements at high temperatures. As for acrylic type adhesive materials, SK-1425 (Product name of Soken Chemical Co., Ltd.) is preferable for its high adhesive strength and good workability.

As for the thermally conductive filler, those having relatively high thermal conductivity are preferable so that the thermal conductivity of the adhesive layer as a whole is maintained relatively high too. Especially, fillers having a thermal conductivity which is higher than that of the adhesive material by 2 W/(m·K) or greater is preferable, and more preferably the difference is 5 W/(m·K) or greater.

Examples of thermally conductive filler include; powder of metal oxides such as silver oxide, copper oxide, aluminum oxide, titanium oxide, zinc oxide, magnesium oxide and iron oxide; powder of metal carbonates such as calcium carbonate, magnesium carbonate and zinc carbonate; powder of metal hydroxides such as aluminum hydroxide and magnesium hydroxide; powder of nitrides such as boron nitride, aluminum nitride, silicon nitride and carbon nitride; silicon carbide powder; and diamond powder. Among these, aluminum oxide, titanium oxide, zinc oxide, aluminum hydroxide, magnesium hydroxide, boron nitride and aluminum nitride are preferable because they are relatively high in thermal conductivity and are easy to handle.

For reference purposes, thermal conductivity data of various thermally conductive filler materials are given below.
[Reference-Purpose Data (3); Thermal Conductivities of Various Thermally Conductive Filler Materials]
aluminum oxide: 36 W/(m·K)
titanium oxide: 8 W/(m·K)
zinc oxide: 25 W/(m·K)
boron nitride; 210 W/(m·K)

The blending quantity of the thermally conductive filler is 100-4,000 mass parts relative to 100 mass parts of the adhesive material, or preferably 200-4,000 parts relative to the same. If the content of the thermally conductive filler is smaller than 100 mass parts, the thermal conductivity of the adhesive layer would be insufficient, and if the content is greater than 4,000 mass parts, it becomes impossible to conduct uniform mixing with the adhesive material.

The adhesive composition of the present invention can be one wherein only thermally conductive filler is mixed in an adhesive material, or it is also possible that the adhesive composition further contains one or more kinds of arbitrary additives such as coloring agent and antioxidant, if need be, so long as such addition does not prevent the attainment of the objects of the invention.

Figure 2:
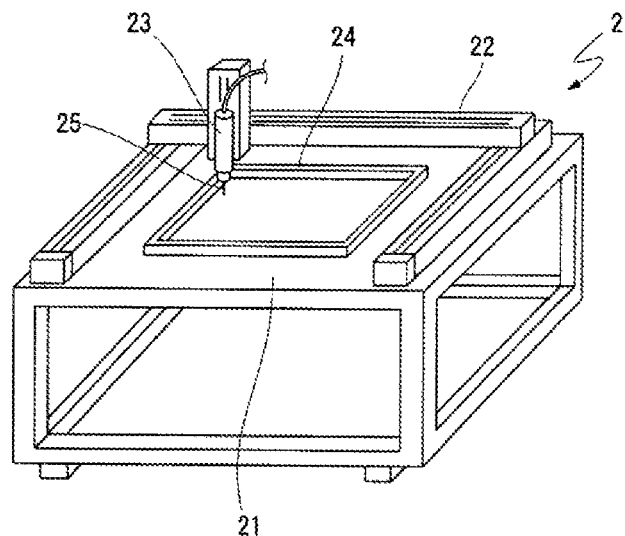
FIG. 2 A schematic perspective view of an adhesive application apparatus which can be employed for the purpose of the present invention.

The application of the adhesive composition to the pellicle frame can be conducted on an adhesive dispenser machine, for example. FIG. 2 is a schematic view showing an example of such an adhesive dispenser machine, which can be suitably used to form the adhesive layer in the course of manufacturing a pellicle according to the present invention. In this adhesive dispenser machine 2, a syringe 23 is held above a pedestal table 21 via a triaxial robot 22, which is constituted by a combination of a stationary rail and a movable rail, in a manner such that the syringe 23 is enabled to move in directions of x, y and z axes. This syringe 23 has a needle 25 at its forefront; and the syringe 23 filled with the adhesive composition is connected to an air pressure type dispensing means (not shown) and both the robot operation and the liquid discharge operation are controlled by a control means (not shown) of the triaxial robot 22. The pellicle frame 24 is set on the pedestal table 21 of the adhesive dispenser machine 2 (with the upper end face of the pellicle frame facing upward) and the adhesive composition for pellicle of the present invention is dropped from the needle 25 while the syringe is shifted, whereby the adhesive composition can be applied endlessly to the pellicle frame 24.

As for a transport means (not shown) for the adhesive, it is possible to select from various types which have a function of controlling the supply rate and the timings of discharge and non-discharge, such as a syringe pump, a plunger pump, a tube pump as well as a pneumatic type system using air pressure, nitrogen gas pressure or the like.

Further, if it is difficult to dispense the adhesive composition because of high viscosity thereof, it is possible, depending on the degree of necessity, to dilute the adhesive composition with a solvent, for example an aromatic solvent such as toluene and xylene, or an aliphatic solvent such as hexane, octane, isooctane, and isoparaffin, or a ketone solvent such as methyl ethyl ketone and methyl isobutyl ketone, or an ester solvent such as ethyl acetate and butyl acetate, or an ether solvent such as diisopropyl ether and 1,4-dioxane, or a mixture of any of these.

The agglutinant layer 14 is formed on the lower end face of the pellicle frame 13, and it is used only for the bonding of the pellicle to the photo mask. There is no limitation as to the kind of the agglutinant material to be adopted, and it is possible to use any conventionally used one such as silicone type agglutinant or acrylic type agglutinant. The manner of applying the agglutinant material is similar to the case of the adhesive composition stated above. Also, a releasing layer (separator) 15 is used for the protection of the agglutinant layer 14 until the pellicle is about to be adhered to the photo mask, and hence it is removed before the pellicle is put in use. For this reason, the releasing layer (separator) is used only in such cases where the agglutinant layer is not protected otherwise and thus in need of being protected during the time until the pellicle is adhered to the photomask. The product pellicle is distributed in the market generally in the form in which the releasing layer (separator) is attached to the agglutinant layer. Choice of the material for the releasing layer (separator) is not limited, and can be made from anything conventionally known to have been used. Also, the releasing layer (separator) can be adhered to the agglutinant layer by any known tape adhesion method.

EXAMPLES

Now, the present invention will be explained in detail with reference to examples and comparative examples, but the invention is not limited to the examples.

Example 1

Firstly, a rectangular pellicle frame made of an aluminum alloy measuring externally 782 mm×474 mm, internally 768 mm×456 mm, and 5.0 mm in height, was cut out, wherein the inner and outer side edges of both the upper and lower end faces (where the end faces meet with the inner or outer side walls of the pellicle frame) were rounded by machining so that the reduced flat portions of the end faces had a width of 4.0 mm; also the four inner corners of the pellicle frame were rounded by machining to R:2.0 mm and the four outer corners were similarly machined to R:6.0 mm; then the surfaces of the frame were subjected to a black colored alumite treatment. This pellicle frame was then brought in a clean room, and after being thoroughly washed with a neutral detergent and pure water, it was dried completely.

Next, the thus prepared pellicle frame 24 was fixed on the pedestal table 21 of the adhesive dispenser machine 2, shown in FIG. 2, in a manner such that the upper end face of the pellicle frame 24 (the face to receive the adhesive) looked upward.

Meanwhile, a uniform composition was prepared by combining and mixing 100 mass parts of silicone type adhesive KE-101A/B (commercial name of a silicone type adhesive product of Shin-Etsu Chemical Co., Ltd., whose thermal conductivity after curing is 0.2 W/(m·K)) with 400 mass parts of Alumina AS-30 (commercial name of an aluminum oxide powder product of Showa Denko K.K.) and 200 mass parts of Alumina AL-47-1 (commercial name of an aluminum oxide powder product of Showa Denko K.K.), and finally diluting the mixture with 100 mass parts of toluene; thus a raw adhesive composition material was obtained.

Then, the syringe 23 made of polypropylene (PP) of the adhesive dispenser machine 2, shown in FIG. 2, was filled with the thus prepared raw adhesive composition material. The syringe 23 was connected to an air pressure type dispenser, not shown, (manufactured by Iwashita Engineering Co., Ltd.), and both the robot operation and the application liquid discharge operation were controlled by a control means (not shown) of the triaxial robot 22; thus, through an automatic operation, the raw adhesive composition material was dropped from the needle 25 onto the upper end face of the pellicle frame 24 in a manner such that the entire flat area of the upper end face of the frame 24 was applied with the adhesive material.

Next, the raw adhesive composition material was dried by air until it lost fluidity; then silicone type agglutinant X-40-3122 (commercial name of a silicone type adhesive product of Shin-Etsu Chemical Co., Ltd.) was applied to the lower end face of the pellicle frame for bonding the pellicle to a photo mask. Then, the pellicle frame was heated to 130 degrees C. by a high frequency induction heater whereby the solvent was completely evaporated from the raw adhesive composition material and the silicone type agglutinant so that they were hardened and formed the adhesive layer and the agglutinant layer, respectively.

Next, a pellicle film was adhered to the upper end face of the pellicle frame via the raw adhesive composition material, and excessive part of the pellicle film extending beyond the pellicle frame was trimmed off with a knife cutter, whereby a pellicle was completed.

Example 2

A pellicle was made in exactly the same manner as in Example 1 except that a different raw adhesive composition material was used, which was prepared by combining and mixing 100 mass parts of silicone type adhesive KE-101A/B (commercial name of a silicone type adhesive product of Shin-Etsu Chemical Co., Ltd., whose thermal conductivity after curing is 0.2 W/(m·K)) with 400 mass parts of BW-53 (commercial name of an aluminum hydroxide powder product of Nippon Light Metal Co., Ltd.) and 200 mass parts of BF-013 (commercial name of an aluminum hydroxide powder product of Nippon Light Metal Co., Ltd.), and finally diluting the mixture with 100 mass parts of toluene.

Example 3

A pellicle was made in exactly the same manner as in Example 1 except that a different raw adhesive composition material was used, which was prepared by combining and mixing 100 mass parts of acrylic type adhesive SK-1425 (commercial name of an acrylic type adhesive product of Soken Chemical Co., Ltd., whose thermal conductivity after curing is 0.2 W/(m·K)) with 400 mass parts of Alumina AS-30 (commercial name of an aluminum oxide powder product of Showa Denko K.K.) and 200 mass parts of Alumina AL-47-1 (commercial name of an aluminum oxide powder product of Showa Denko K.K.), and finally diluting the mixture with 100 mass parts of toluene.

Example 4

A pellicle was made in exactly the same manner as in Example 1 except that a different raw adhesive composition material was used, which was prepared by combining and mixing 100 mass parts of silicone type adhesive KE-101A/B (commercial name of a silicone type adhesive product of Shin-Etsu Chemical Co., Ltd., whose thermal conductivity after curing is 0.2 W/(m·K)) with 100 mass parts of Alumina AS-30 (commercial name of an aluminum oxide powder product of Showa Denko K.K.) and 50 mass parts of Alumina AL-47-1 (commercial name of an aluminum oxide powder product of Showa Denko K.K.), and finally diluting the mixture with 100 mass parts of toluene.

Example 5

A pellicle was made in exactly the same manner as in Example 1 except that a different raw adhesive composition material was used, which was prepared by combining and mixing 100 mass parts of silicone type adhesive KE-101A/B (commercial name of a silicone type adhesive product of Shin-Etsu Chemical Co., Ltd., whose thermal conductivity after curing is 0.2 W/(m·K)) with 2400 mass parts of Alumina AS-30 (commercial name of an aluminum oxide powder product of Showa Denko K.K.) and 1200 mass parts of Alumina AL-47-1 (commercial name of an aluminum oxide powder product of Showa Denko K.K.), and finally diluting the mixture with 100 mass parts of toluene.

Comparative Example 1

A pellicle was made in exactly the same manner as in Example 1 except that a different raw adhesive composition material was used, which was prepared by combining and mixing 100 mass parts of silicone type adhesive KE-101A/B (commercial name of a silicone type adhesive product of Shin-Etsu Chemical Co., Ltd., whose thermal conductivity after curing is 0.2 W/(m·K)) with 60 mass parts of Alumina AS-30 (commercial name of an aluminum oxide powder product of Showa Denko K.K.) and 30 mass parts of Alumina AL-47-1 (commercial name of an aluminum oxide powder product of Showa Denko K.K.), and finally diluting the mixture with 100 mass parts of toluene.

Comparative Example 2

In order to obtain a raw adhesive composition material, 100 mass parts of silicone type adhesive KE-101A/B (commercial name of a silicone type adhesive product of Shin-Etsu Chemical Co., Ltd., whose thermal conductivity after curing is 0.2 W/(m·K)) was mixed with 3000 mass parts of Alumina AS-30 (commercial name of an aluminum oxide powder product of Showa Denko K.K.) and with 1500 mass parts of Alumina AL-47-1 (commercial name of an aluminum oxide powder product of Showa Denko K.K.); however, the filling amount of the thermally conductive powders was too much for the silicone type adhesive so that it was not possible to prepare a uniform composition material.

The pellicles prepared in Examples 1 through 5 and Comparative Example 1 were subjected to the following heat test and thermal conductivity measurement.

[Heat Test]

The pellicles prepared in Examples 1 through 5 and Comparative Example 1 were each bonded to a glass plate and were subjected to the heat test. The method of bonding them to the glass plate and conditions of the heat test are as follows.

The pellicle was placed on the glass plate with the lower end face of the frame (agglutinant layer side) contacting the glass plate, and the pellicle frame was pushed against the glass plate with a pressure of 10 MPa for five minutes by a press machine whereby a sample for evaluation consisting of the pellicle and the glass plate was prepared. Each sample for evaluation was put in an oven wherein the sample was placed in a manner such that the pellicle film is exposed to an air flow of 120 degrees C., and this heat test was kept for 240 hours on end. The appearance of the pellicle before and after the heat test was observed. The result of the evaluation is shown in Table 1.

[Thermal Conductivity Measurement]

A metallic framed container measuring 75 mm×150 mm was filled with each lot of the raw adhesive composition material prepared in Examples 1 through 5 and Comparative Example 1 in a manner such that after the curing the respective raw adhesive composition material becomes a block with a thickness of 12 mm. The curing was conducted in the following manner: the metallic framed container filled with the raw adhesive composition material was placed on a hot plate and was heated at 130 degrees C. so that all the solvent evaporated and the raw adhesive composition material hardened, and accordingly a sample for thermal conductivity measurement was obtained. This sample was measured for thermal conductivity by a quick thermal conductivity measuring apparatus named Kemtherm QTM-D3 (a product of Kyoto Electronics Industry Co., Ltd.). The result is shown in Table 1.

[Overall Evaluation]

An overall evaluation of the pellicles was conducted based on the results of the heat test and the thermal conductivity measurement. The result is shown in Table 1, wherein "Success" represents a situation in which both the appearance of the pellicle and the measured value of the thermal conductivity were good; and "Failure" represents a situation in which either the appearance of the pellicle or the measured value of the thermal conductivity was not good.

TABLE 1

|  | Example 1 | Example 2 | Example 3 | Example 4 | Example 5 | Comparative Example 1 |
|---|---|---|---|---|---|---|
| Appearance of pellicle just after adhesion to glass plate | Good | Good | Good | Good | Good | Good |
| Appearance of pellicle after the heat test | Good | Good | Good | Good | Good | No good (film had wrinkles) |
| Thermal conductivity W(m · K) | 1.7 | 1.7 | 1.7 | 0.7 | 4.1 | 0.4 |
| Overall evaluation | Success | Success | Success | Success | Success | Failure |

From the data shown in Table 1, it is known that in Examples 1 through 5 the heat possessed by the pellicle film was quickly passed to the pellicle frame by virtue of the highly thermally conductive adhesive layer and that the heat was effectively released from the pellicle; hence it was confirmed that, according to the present invention, it is possible to provide a pellicle for EUV which is capable of preventing its film from deforming, breaking or falling during the high temperature operation of EUV light exposure lithography.

EXPLANATION FOR REFERENCE NUMERALS

1: pellicle
2: adhesive dispenser machine
11: pellicle film
12: adhesive layer
13: pellicle frame
14: agglutinant layer
15: releasing layer (separator)
21: pedestal table
22: triaxial robot
23: syringe
24: pellicle frame
25: needle Scopes of what is claimed:
1. A pellicle for EUV comprising a pellicle frame having two end faces, an adhesive layer laid on one of said end faces of the pellicle frame, a pellicle film which is tensely adhered to the pellicle frame via said adhesive layer, and an agglutinant layer laid on another one of said end faces of the pellicle frame, wherein said adhesive layer is an adhesive composition made of 100 mass parts of an adhesive material and 100 through 4,000 mass parts of thermally conductive filler.

2. A pellicle for EUV as claimed in claim 1, wherein said thermally conductive filler is at least one selected from powder of a metal oxide, powder of a metal carbonate, powder of a metal hydroxide, powder of a nitride, powder of silicon carbide, and powder of diamond.

3. A pellicle for EUV as claimed in claim 1, wherein said thermally conductive filler is at least one selected from aluminum oxide, titanium oxide, and zinc oxide.

4. A pellicle for EUV as claimed in claim 1, wherein said thermally conductive filler is at least one selected from aluminum hydroxide and magnesium hydroxide.

5. A pellicle for EUV as claimed in claim 1, wherein said thermally conductive filler is at least one selected from boron nitride and aluminum nitride.

6. A pellicle for EUV as claimed in claim 1, wherein said adhesive material is a silicone type adhesive.

7. A pellicle for EUV as claimed in claim 1, wherein said adhesive material is an acrylic type adhesive.

8. A pellicle for EUV as claimed in claim 1, wherein said pellicle frame is made of silicon.

9. A pellicle for EUV as claimed in claim 1, wherein said pellicle film is made of silicon.

* * * * *